US009159387B2

(12) United States Patent
Byeon

(10) Patent No.: US 9,159,387 B2
(45) Date of Patent: Oct. 13, 2015

(54) MEMORY CHIP AND SEMICONDUCTOR PACKAGE INCLUDING THE SAME

(71) Applicant: SK hynix Inc., Gyeonggi-do (KR)

(72) Inventor: Sang-Jin Byeon, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 101 days.

(21) Appl. No.: 14/043,478

(22) Filed: Oct. 1, 2013

(65) Prior Publication Data
US 2014/0355363 A1    Dec. 4, 2014

(30) Foreign Application Priority Data

May 28, 2013  (KR) .................... 10-2013-0060301

(51) Int. Cl.
G11C 7/22    (2006.01)
G11C 7/10    (2006.01)

(52) U.S. Cl.
CPC  *G11C 7/222* (2013.01); *G11C 7/10* (2013.01); *G11C 7/106* (2013.01); *G11C 7/1087* (2013.01); *G11C 2207/107* (2013.01)

(58) Field of Classification Search
CPC ....................................... G11C 7/222
USPC .................................... 365/189.17
See application file for complete search history.

(56) References Cited

U.S. PATENT DOCUMENTS 7,835,207 B2    11/2010  Keeth et al.
2009/0161401 A1*  6/2009  Bilger et al. .............. 365/51
2011/0292708 A1*  12/2011  Kang et al. ............... 365/63

FOREIGN PATENT DOCUMENTS

KR    1020080088166    10/2008

* cited by examiner

Primary Examiner — Huan Hoang
Assistant Examiner — Tri Hoang
(74) Attorney, Agent, or Firm — IP & T Group LLP

(57) ABSTRACT

A memory chip includes a data processing block suitable for serial-parallel converting data inputted and for parallel-serial converting data to be outputted, a write data transmitting unit suitable for transmitting the data serial-parallel converted by the data processing block to a write data interlayer channel, a write data receiving unit suitable for receiving data from the write data interlayer channel, the data to be written to a core area, a read data receiving unit suitable for receiving data from a read data interlayer channel, the data to be parallel-serial converted by the data processing block, and a read data transmitting unit suitable for transmitting data read from the core area to the read data interlayer channel.

15 Claims, 4 Drawing Sheets

MEMORY CHIP AND SEMICONDUCTOR PACKAGE INCLUDING THE SAME

CROSS-REFERENCE TO RELATED APPLICATIONS

The present application claims priority of Korean Patent Application No. 10-2013-0060301, filed on May 28, 2013, which is incorporated herein by reference in its entirety.

BACKGROUND

1. Field

Exemplary embodiments of the present invention relate to a memory chip and a semiconductor package including a plurality of memory chips.

2. Description of the Related Art

According to the recent trend, the capacity and speed of a semiconductor memory used as a memory device in most electronic systems have been increasing. Furthermore, various attempts have been made to mount a memory with a larger capacity in a smaller area and to effectively drive the memory.

In order to increase the integration degree of a memory, a three-dimensional (3D) structure including a plurality of memory chips stacked therein started to be applied instead of an existing two-dimensional (2D) structure. As memories with a high integration degree and a high capacity are needed, a 3D stacked structure of a memory chip may be used to increase a capacity and reduce a semiconductor chip size, thereby improving an integration degree.

As the 3D stacked structure, a through-silicon via (TSV) structure may be applied. The TSV structure is considered as an alternative for overcoming the reduction of transmission speed depending on a distance from a controller on a module, the vulnerability of data bandwidth, and the degradation of transmission speed depending on variables on a package. The TSV structure includes a path formed through a plurality of memory chips and an electrode formed in the path to perform communication between the stacked chips.

SUMMARY

Various embodiments are directed to a technology capable of controlling a plurality of memory chips to operate as a master or slaves through settings, while the memory chips stacked in one package have the same configuration.

In an embodiment, a memory chip may include a data processing block suitable for serial-parallel converting data inputted and for parallel-serial converting data to be outputted, a write data transmitting unit suitable for transmitting the data serial-parallel converted by the data processing block to a write data interlayer channel, a write data receiving unit suitable for receiving data from the write data interlayer channel, the data to be written to a core area, a read data receiving unit suitable for receiving data from a read data interlayer channel, the data to be parallel-serial converted by the data processing block, and a read data transmitting unit suitable for transmitting data read from the core area to the read data interlayer channel. Enablement of the data processing block, the write data transmitting unit, and the read data receiving unit depends on whether the memory chip is set as master or slave.

In an embodiment according to the present invention, a memory chip may include an address interface unit suitable for transferring an inputted address to an address interlayer channel, a command interface unit suitable for transferring an inputted command to a command interlayer channel, and a clock interface unit suitable for transferring an inputted clock to a clock interlayer channel. Enablement of the address interface unit, the command interface unit, and the clock interface unit depends on whether the memory chip is set as master or slave.

In an embodiment, a semiconductor package may include a plurality of memory chips stacked. One of the memory chips is set as master and the remaining memory chips are set as slaves, so that the memory chip set as master serial-parallel converts the write data inputted from outside, then transfers the serial-parallel converted data to a memory chip selected to be accessed from the memory chips set as slaves, and the memory chip set as master parallel-serial converts read data from a memory chip selected to be accessed from the memory chips set as slaves, then outputs the parallel-serial converted data to the outside.

DETAILED DESCRIPTION

Figure 1:
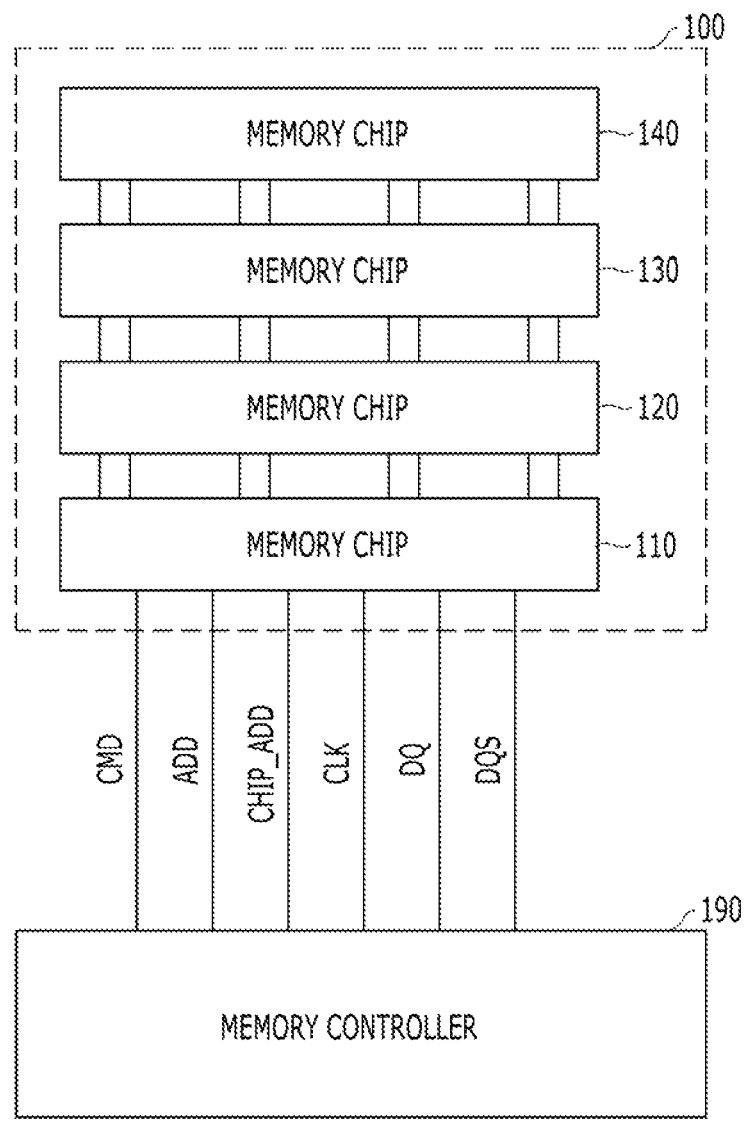
FIG. 1 is a diagram of a memory system in accordance with an embodiment of the present invention.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, reference numerals correspond directly to the like numbered parts in the various figures and embodiments of the present invention. It is also noted that in this specification, "connected/coupled" refers to one component not only directly coupling another component but also indirectly coupling another component through an intermediate component. In addition, a singular form may include a plural form as long as it is not specifically mentioned in a sentence.

FIG. 1 is a diagram of a memory system in accordance with an embodiment of the present invention.

Referring to FIG. 1, the memory system includes a semiconductor package 100 including a plurality of memory chips 110 to 140 and a memory controller 190 for controlling the semiconductor package 100.

The memory controller 190 may transmit a command CMD, an address ADD, a chip address CHIP_ADD, and a clock CLK to the semiconductor package 100, and exchange data DQ and a data strobe signal DQS with the semiconductor package 100. In FIG. 1, each of the channels CMD, ADD, CHIP_ADD, CLK, DQ, and DQS is illustrated as one transmission line but may include a plurality of transmission lines. The command CMD refers to signals indicating operations, which the memory controller 190 instructs the memory chips 110 to 140 to perform.

The command CMD may include a chip select signal CS, an active signal ACT a row address strobe signal RAS, a column address strobe signal CAS, a write enable signal WE, a clock enable signal CKE, and the like. Examples of the operations which the memory controller 190 instructs the memory chips to perform through the CMD may include an active operation, a read operation, a write operation, a precharge operation, a refresh operation, and the like.

The chip address CHIP_ADD refers to signals for designating a memory chip to be accessed or to perform a read or write operation among the memory chips 110 to 140 of the semiconductor package 100, and the address ADD refers to signals for designating the position of a memory cell to be accessed inside a selected memory chip. In FIG. 1, the chip address CHIP_ADD and the address ADD are separately illustrated. However, a part of the address ADD (for example, upper 2 bits) may be used as a chip address.

The clock CLK is supplied to the semiconductor 100 from the memory controller 190 for the synchronized operation of the memory chips 110 to 140 in the semiconductor package 100. The data strobe signal DQS for strobing data DQ is transmitted to the semiconductor package 100 from the memory controller 190 during a write operation and transmitted to the memory controller 190 from the semiconductor package 100 during a read operation. That is, the transmission direction of the data strobe signal DQS, coincides with the transmission direction of the data DQ. The clock CLK and the data strobe signal DQS may be transmitted in a differential manner.

The semiconductor package 100 includes the memory chips 110 to 140. Among the memory chips 110 to 140, one chip 110 is set as a master, and the other chips 120 to 140 are set as slaves. The memory chips 110 to 140 may be stacked in the semiconductor package 100, and signal transmission among the memory chips 110 to 140 may be performed through interlayer channels. The interlayer channel may be formed with a through-silicon via (TSV). The memory controller 190 and the semiconductor package 100 directly communicate with each other through the master 110, and the slaves 120 to 140 indirectly communicate with the memory controller 190 through the master 110. That is, channels CMD, ADD, CHIP_ADD, CLK, DQ, and DQS between the memory controller 190 and the semiconductor package 100 are connected only to the master 110.

During a write operation, write data transmitted to the semiconductor package 100 is serial-parallel converted and then stored in a memory cell of a selected memory chip among the memory chips 110 to 140. The write data is processed by the master 110 and then transferred to the selected memory chip (master or slave). During a read operation, data read from a selected memory chip among the memory chips 110 to 140 is parallel-serial converted and then transferred to, the memory controller 190. The read data is processed by the master 110 and then transferred to the memory controller 190. That is, during the write and read operations, the operations of processing data, that is, the serial-parallel conversion and the parallel-serial conversion are performed by the master 110. The command CMD, the address ADD, the chip address CHIP_ADD, and the dock CLK are buffered by the master 110 and then transferred to the other chips 120 to 140 without a separate process.

In this embodiment of the present invention, the memory chips 110 to 140 stacked in the semiconductor package 100 have the same configuration. Thus, the memory chips 110 to 140 may be fabricated in the same manner. Depending on settings, however, each of the memory chips 110 to 140 may operate as a master or a slave. This will be described below.

Figure 2:
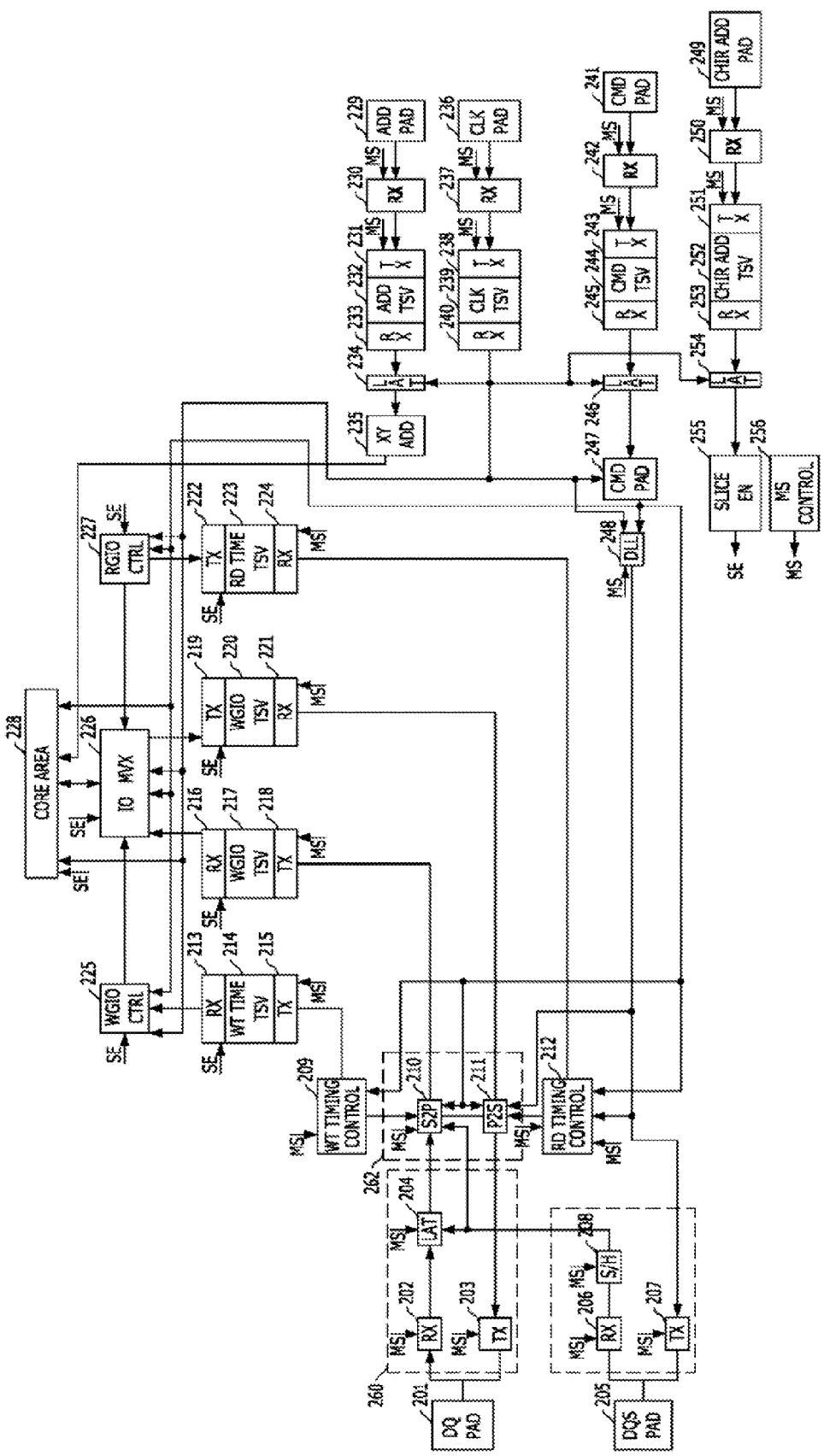
FIG. 2 is a configuration diagram of a memory chip in accordance with an embodiment of the present invention.

FIG. 2 is a configuration diagram of a memory chip in accordance with an embodiment of the present invention.

FIG. 2 illustrates only the memory chip 110 among the memory chips 110 to 140 of FIG. 1, but the other memory chips 120 to 140 may be configured in the same manner as the memory chip 110.

A master/slave setting unit 256 may generate a master/slave setting signal MS for setting the memory chip 110 as a master/slave. The master/slave setting of the master/slave setting unit 256 may be determined through a programming operation during a fabrication process of the memory chip 110 or a setting operation during a reset process for the memory chip 110. For example, the programming operation may be performed by cutting or not cutting a fuse, and the setting operation may include a MS setting. When the memory chip 110 is set as master, the master/slave setting signal MS is activated, and when the memory chip 110 is set as slave, the master lave setting signal MS is deactivated.

A data pad 201 serves to receive or output data. When the memory chip 110 is the master, a data channel (DQ of FIG. 1) connected to the memory controller 190 is connected to the data pad 201. However, when the memory chip 110 is a slave, no data channel is connected to the data pad 201. FIG. 2 illustrates only one data pad 201, but a plurality of data pads 201 may be formed.

A data input/output unit 260 may input and output data through the data pad 201. A data input unit 202 may buffer data inputted through the data pad 201 from the outside of the chip and transfer the buffered data to a latch 204. The latch 204 may latch the data buffered by the data input unit 202 in synchronization with a data strobe signal received from a setup/hold control unit 208. A data output unit 203 may output data to the outside of the chip through the data pad 201. The components of the data input/output unit 260 are enabled when the memory chip 110 is set as master (MS=high), and disabled when the memory chip 110 is set as slave (MS=low). When the memory chip 110 is set as slave, no data channel is connected to the data pad 201. Thus, the data input/output unit 260 does not need to operate.

A data strobe pad 205 serves to receive or output a data strobe signal. When the memory chip 110 is the master, the data strobe channel (DQS of FIG. 1) connected to the memory controller 190 is connected to the data strobe pad 205. However, when the memory chip 110 is a slave, no data strobe channel is connected to the data strobe pad 205. FIG. 2 illustrates only one data strobe pad 205, but a plurality of data strobe pads 205 may be formed.

A data strobe input/output unit 264 may input/output a data strobe signal through the data strobe pad 205. A data strobe input unit 206 may buffer the data strobe signal inputted through the data strobe pad 205 and transfer the buffered signal to the setup/hold control unit 208. The setup/hold control unit 208 may control a setup/hold margin of the buffered data strobe signal and then transfer the controlled data strobe signal to components 204 and 210 requiring the data strobe signal. A data strobe output unit 207 may output a data strobe signal synchronized with the data outputted through the data output unit 203, that is, a clock generated through a delay locked loop (DLL) 248 through the data strobe pad 205. The components of the data strobe input/output unit 264 are enabled when the memory chip 110 is set as master (MS=high), and disabled when the memory chip 110 is set as slave (MS=low). When the memory chip 110 is set as slave, no data strobe channel is connected to the data strobe pad 205. Thus, the data strobe input/output unit 264 does not need to operate.

A data processing block 262 may serial-parallel convert data inputted through the data input/output unit 260 (that is, write data), and parallel-serial convert data that is to be outputted through the data input/output unit (that is, read data). The memory chip 110 internally processes data in parallel at the same time, and serially transmits data to the outside of the memory chip 110. For example, when 64 data are transferred through the data input/output unit 260, every eight data may be serially aligned with eight lines. In the right side of the data processing block, 64 data may be serially aligned one-by-one with 64 lines and then transferred. A serial-parallel conversion unit 210 may serial-parallel convert the write data received from the latch 204 in synchronization with the data strobe signal received from the setup/hold control unit 208. The serial-parallel conversion unit 210 is used during a write operation, and this may be controlled by a command decoder 247. Furthermore, the operation timing of the serial-parallel conversion unit 210 is controlled by a write timing control unit 209. A parallel-serial conversion unit 211 may parallel-serial convert read data received from a read data receiving unit 221 in synchronization with an output clock of the DLL 248, and transfer the converted data to the data output unit 203. The parallel-serial conversion unit 211 is used during a read operation, and this may be controlled by the command decoder 247. Furthermore, the operation timing of the parallel-serial conversion unit 211 is controlled by a read timing control unit 212. The components 210 and 211 of the data processing block 252 are enabled when the memory chip 110 is set as master (MS=high), and disabled when the memory chip 110 is set as slave (MS=high).

A write interlayer channel 217 serves to transfer write data between the respective memory chips 110 to 140. Furthermore a read interlayer channel 220 serves to transfer read data between the respective memory chips 110 to 140. As well known in the art, the write interlayer channel 217 and the read interlayer channel 218 may be formed with TSVs passing through the memory chips 110 to 140.

A write data transmitting unit 218 may transmit the write data serial-parallel converted by the serial-parallel conversion unit 210 to the write interlayer channel 217. The write data transmitting unit 218 is enabled when the memory chip 110 is set as master, and disabled when the memory chip 110 is set as slave. A write data receiving unit 216 may receive the write data loaded in the write interlayer channel 217. The write data receiving unit 216 is enabled when a slice select signal SE activated when the memory chip 110 is selected to be accessed is activated, and disabled when the slice select signal SE is deactivated. For example, when the memory chip 130 of the memory chips 110 to 140 is selected to be accessed only the write data receiving unit 216 of the memory chip 130 is enabled.

A read data transmitting unit 219 may transmit read data, read from a core area 228 and transferred through a data exchange unit 226, to the read interlayer channel 220. The read data transmitting unit 219 is enabled when the slice select signal SE activated when the memory chip 110 is selected to be accessed is activated, and disabled when the slice select signal SE is deactivated. For example, when the memory chip 130 of the memory chips 110 to 140 is selected to be accessed only the read data transmitting unit 219 of the memory chip 130 is enabled. A read data receiving unit 221 may receive the read data loaded in the read interlayer channel 220. The read data receiving unit 221 is enabled when the memory chip 110 is set as master (MS='high') and disabled when the memory chip 110 is set as slave (MS='low').

The data exchange unit 226 may control data exchange between the write data receiving unit 216 and the core area 228 and data exchange between the read data receiving unit 219 and the core area 228. Timing control for the data exchange unit 226 may be performed through a write bus control unit 225 and a read bus control unit 227. The data exchange unit 226 is enabled when the slice select signal SE is activated when the memory chip 110 is selected to be accessed is activated, and disabled when the slice select signal SE is deactivated.

The core area 228 serves to store data in the memory chip 110. The core area 228 may include well-known components of a memory, such as a cell array, a row decoder, a column decoder, a write driver, and a sense amplifier. The core area 228 may operate in synchronization with a clock transferred from a clock receiving unit 240. According to control of the command decoder 247, the core area 228 writes the write data transferred from the data exchange unit 226 to a position designated by an address transferred from a row/column address generation unit 235 during a write operation. Furthermore, the core area 228 reads data from a position designed by an address transferred from the row/column address generation unit 235 and transfers the read data to the data exchange unit 226. The core area 228 is enabled when the slice select signal SE is activated when the memory chip 110 is selected to be accessed is activated, and disabled when the slice select signal SE is deactivated.

The write timing control unit 209 may control the operation timing of the serial-parallel conversion unit 210. Data are inputted through the data pad 201 in a predetermine time after a write command is recognized by the command decoder 247. The write timing control unit 209 controls the operation timing of the serial-parallel conversion unit 210 so that the data are inputted to the serial-parallel conversion unit 210 at a proper time. Furthermore, the write timing control unit 209 controls the operation timing of the serial-parallel conversion unit 210 so that the data serial-parallel converted by the serial-parallel conversion unit 210 are transferred to the write data transmitting unit 218 at a proper time. The write timing control unit 209 transfers information, which are related to the time point at which data are transferred to the write data transmitting unit 218 from the serial-parallel conversion unit 210, to a write timing interface unit 215. The write timing control unit 209 is enabled when the memory chip 110 is set as master (MS='high'), and disabled when the memory chip 110 is set as slave (MS='low').

The write timing interface unit 215 may transmit the timing information received from the write timing control unit 209 to a write timing interlayer channel 214. The timing information may include information on the timing at which write data are transferred to the write data transmitting unit 218 from the serial-parallel conversion unit 210. The write timing interface unit 215 is enabled when the memory chip 110 is set as master (MS='high') and disabled when the memory chip 110 is set as slave.

The write timing interlayer channel 214 serves to transfer write timing information between the respective memory chips 110 to 140. The read timing interlayer channel 223 serves to transfer read timing information between the respective memory chips 110 to 140. The write timing interlayer channel 214 and the read timing interlayer channel 223 may be formed with TSVs passing through the memory chips 110 to 140.

A write timing receiving unit 213 may receive the timing information loaded in the write timing interlayer channel 214 and transfer the received information to the write bus control unit 225. The write timing receiving unit 213 is enabled when the slice select signal SE is activated when the memory chip 110 is selected to be accessed is activated, and disabled when the slice select signal SE is deactivated.

The write bus control unit 225 may control data transfer timing of the data exchange unit 226 from the write data receiving unit 216 to the core area 228, using the timing information received from the write timing receiving unit 213. The timing information received from the write timing receiving unit 213 may include information on the timing at which data are transferred from the serial-parallel conversion unit 210 to the write interlayer channel 217. Thus, when the timing information is used, the transfer timing of write data may be normally controlled. The write bus control unit 225 is enabled when the slice select signal SE is activated when the memory chip 110 is selected to be accessed is activated, and disabled when the slice select signal SE is deactivated. The write bus control unit 225 is controlled by the command decoder 247, and operated in synchronization with a clock. The write bus control unit 225 is enabled when the slice select signal SE is activated when the memory chip 110 is selected to be accessed is activated, and disabled when the slice select signal SE is deactivated.

A read bus control unit 227 may control data transfer timing of the data exchange unit 226 from the core area 228 to the read data transmitting unit 219. The read bus control unit 227 calculates a time from the time point at which a read command is recognized by the command decoder 247 to the time point at which data are read from the core area 228, so that data transmission is performed at a proper timing. Furthermore, the read bus control unit 227 transfers information on the timing at which the read data are transferred from the data exchange unit 226 to the read data transmitting unit 219, to a read timing interface unit 222. The read bus control unit 227 may be controlled by the command decoder 247, and operated in synchronization with a clock. The read bus control unit 227 is enabled when the slice select signal SE is activated when the memory chip 110 is selected to be accessed is activated, and disabled when the slice select signal SE is deactivated.

The read timing interface unit 222 may transmit the timing information received from the read bus control unit 227 to the read timing interlayer channel 223. The timing information may include information on the timing at which the read data are transferred from the data exchange unit 226 to the read data transmitting unit 219. The read timing interface unit 222 is enabled when the slice select signal SE is activated when the memory chip 110 is selected to be accessed is activated, and disabled when the slice select signal SE is deactivated.

A read timing receiving unit 224 may receive the timing information loaded in the read timing interlayer channel 223 and transfer the received information to the read timing control unit 212. The read timing receiving unit 224 is enabled when the memory chip 110 is set as master (MS='high') and disabled when the memory chip 110 is set as slave (MS='low').

The read timing control unit 212 may control the operation timing of the parallel-serial conversion unit 211. The read timing control unit 212 controls the timing at which data are transferred from the read data receiving unit 221 to the parallel-serial conversion unit 211, using the timing information received from the read timing receiving unit 224, and controls the data to be transferred from the parallel-serial conversion unit 211 to the data output unit 203 in a predetermined time after a read command was recognized by the command decoder 244. The read timing control unit 212 is enabled when the memory chip 110 is set as master (MS='high'), and disabled when the memory chip 110 is set as slave (MS='low').

An address pad 229 serves to receive an address. When the memory chip 110 is the master, an address channel (ADD of FIG. 1) connected to the memory controller 190 is connected to the address pad 229. However, when the memory chip 110 is a slave, no address channel is connected to the address pad 229. FIG. 1 illustrates only one address pad 229, but a plurality of address pads 229 may be formed.

An address interface unit 230 may buffer the address received through the address pad 229 and transfer the buffered address to an address receiving unit 231. The address transmitting unit 231 may transmit the address received from the address interface unit 230 to an address interlayer channel 232. The address interlayer channel 232 serves to transfer an address between the respective memory chips 110 to 140, and may be formed with a TSV passing through the memory chips 110 to 140. The address interface unit 230 and the address receiving unit 231 are enabled when the memory chip 110 is set as master (MS='high') and disabled when the memory chip 110 is set as slave (MS='low'). An address receiving unit 233 may receive the address loaded in the address interlayer channel 232. The address receiving unit 233 may be enabled in all of the stacked memory chips 110 to 140.

A clock pad 236 serves to receive a clock. When the memory chip 110 is the master, a clock channel (CLK of FIG. 1) connected to the memory controller 190 is connected to the clock pad 236, but when the memory chip 110 is a slave, no clock cannel is connected to the clock pad 236. FIG. 2 illustrates only one clock pad 236, but a plurality of clock pads 236 may be formed.

A clock interface unit 237 may buffer the clock inputted through the clock pad 236 and transfer the buffered clock to a clock transmitting unit 238. The clock transmitting unit 238 may transmit the clock received from the clock interface unit 237 to a clock interlayer channel 239. The clock interlayer channel 239 serves to transfer a clock between the respective memory chips 110 to 140, and may be formed with a TSV passing through the memory chips 110 to 140. The clock interface unit 237 and the clock transmitting unit 238 are enabled when the memory chip 110 is set as master (MS='high'), and disabled when the memory chip 110 is set as slave (MS='low'). A clock receiving unit 240 may receive the clock loaded in the clock interlayer channel 239. The clock receiving unit 240 may be enabled in all of the stacked memory chips 110 to 140. The clock received by the clock receiving unit 240 is transferred to various components in the memory chip 110.

A command pad 241 serves to receive a command. When the memory chip 110 is the master, a command channel (CMD of FIG. 1) connected to the memory controller 190 is connected to the command pad 241, but when the memory chip 110 is a slave, no command channel is connected to the command pad 241. FIG. 2 illustrates only one command pad 241, but a plurality of command pads 241 may be formed.

A command interface unit 242 may buffer the command received through the command pad 241 and transfer the buffered command to a command transmitting unit 243. The command transmitting unit 243 may transfer the command received from the command interface unit 242 to a command interlayer channel 244. The command interlayer channel 244 serves to transfer a command between the respective memory chips 110 to 140, and may be formed with a TSV passing through the memory chips 110 to 140. The command interface unit 242 and the command transmitting unit 243 are enabled when the memory chip 110 is set as master (MS='high'), and disabled when the memory chip 110 is set as slave (MS='low'). A command receiving unit 245 may receive the command loaded in the command interlayer channel 244. The command receiving unit 245 may be enabled in all of the stacked memory chips 110 to 140.

A chip address pad 249 serves to receive a chip address, When the memory chip 110 is the master, a chip address channel (CHIP_ADD of FIG. 1) connected to the memory controller 190 is connected to the chip address pad 249, but when the memory chip 110 is a slave, no chip address channel is connected to the chip address pad 249. FIG. 2 illustrates only one chip address pad 249, but a plurality of chip address pads 249 may be formed.

A chip address interface unit 250 may buffer the chip address inputted through the chip address pad 249 and transfer the buffered chip address to a chip address transmitting unit 251. The chip address transmitting unit 251 may transmit the chip address received from the chip address interface unit 250 to a chip address interlayer channel 252. The chip address interlayer channel 252 serves to transfer a chip address between the respective memory chips 110 to 140, and may be formed with a TSV passing through the memory chips 110 to 140. The chip address interface unit 250 and the address transmitting unit 251 are enabled when the memory chip 110 is set as master (MS='high'), and disabled when the memory chip 110 is set as slave (MS='low'). A chip address receiving unit 253 may receive the chip address loaded in the chip address interlayer channel 252. The chip address receiving unit 253 may be enabled in all of the stacked memory chips 110 to 140.

A chip address latch unit 254 may latch the chip address received by the chip address receiving unit 253 in synchronization with a clock. A slice select signal generation unit 255 may decode the chip address and generate the slice select signal SE. The slice select signal SE is activated when a corresponding memory chip is selected to be accessed based on the result obtained by decoding the chip address. For example, when the memory chip 120 of the memory chips 110 to 140 is selected to be accessed based on the chip address, the slice select signal SE of the memory chip 120 is activated, and the slice select signals SE of the other memory chips 110, 130, and 140 are deactivated.

An address latch unit 234 may latch the address received by the address receiving unit 233 in synchronization with a clock. The row/column address generation unit 235 separates the address latched by the address latch unit 234 into a row address and a column address. An address inputted with a command to order row-based operation (for example, active operation) is classified into a row address, and an address inputted with a command to order column-based operation (for example, a read or write operation) is classified into a column address. The address classified by the row/column address generation unit 235 is transferred to various components in the memory chip requiring the address.

A command latch unit 246 may latch the command received by the command receiving unit 245 in synchronization with a clock. The command decoder 247 may decode the command latched by the command latch unit 246 and recognize various commands. Since the operations of the internal components of the memory chip 110 are changed according to which operation the memory chip 110 is instructed to perform, the various internal components of the memory chip 110 are controlled by the command decoder 247.

The DLL 248 may generate an internal clock using the clock received from the clock receiving unit 240. The internal clock generated by the DLL 248 is used to align read data. The internal clock becomes a data strobe signal outputted to the outside through the data strobe output unit 207 from the memory chip 110. The DLL 248 is enabled when the memory chip 110 is set as master (MS='high') and disabled when the memory chip 110 is set as slave (MS='low').

Figure 3:
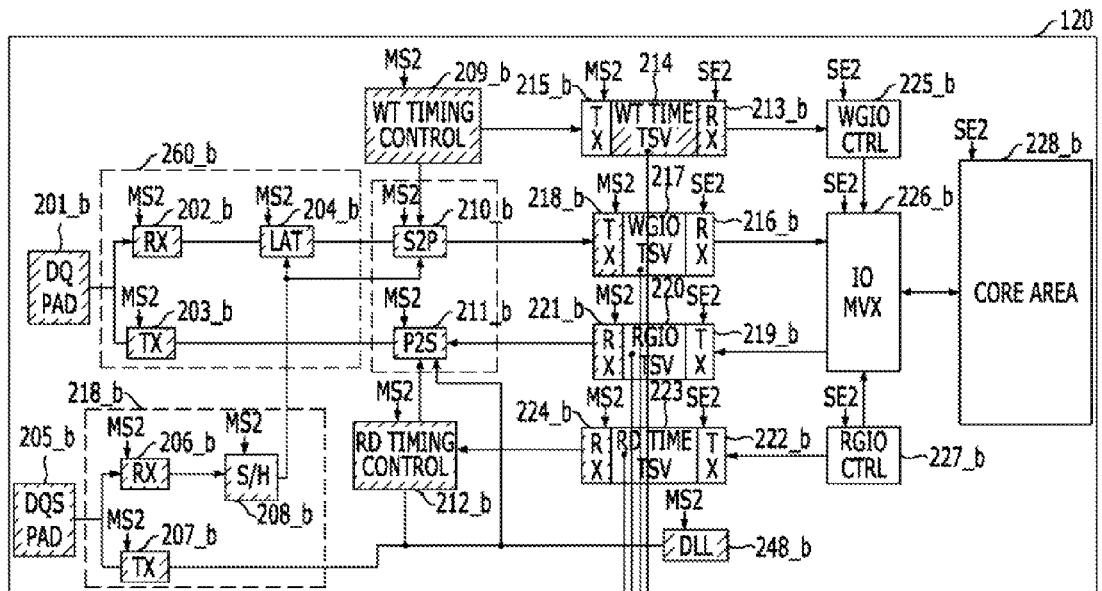
FIG. 3 is a diagram illustrating data transfer paths in memory chips stacked in a semiconductor package in accordance with an embodiment of the present invention.
Figure 3:
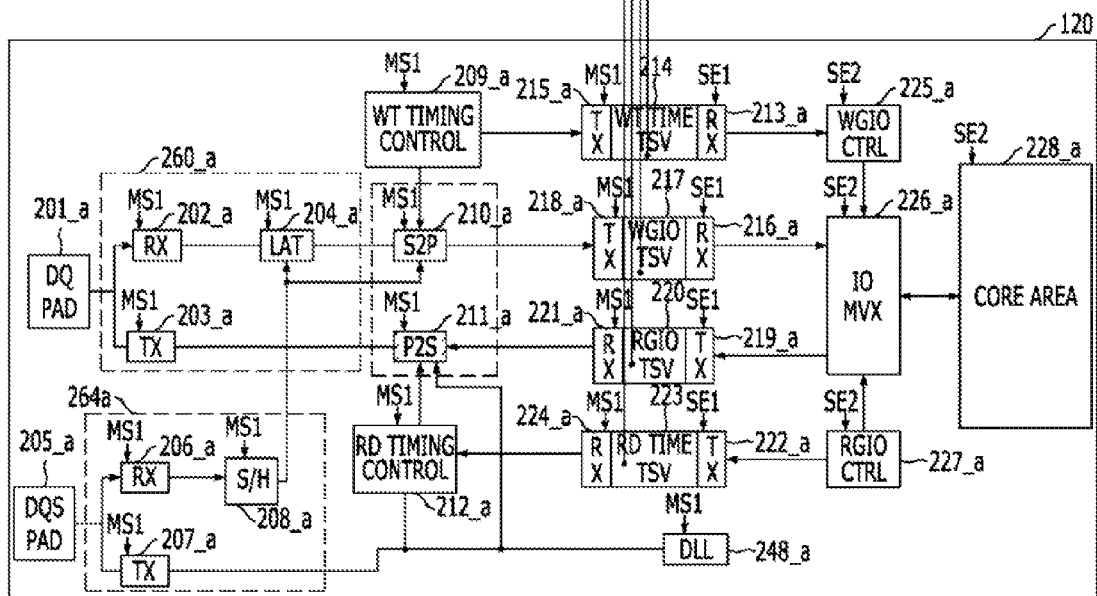

FIG. 3 is a diagram illustrating data transfer paths in the memory chips 110 and 120 stacked within the semiconductor package 100. The respective memory chips have the same configuration as FIG. 2, FIG. 3 further illustrates that two memory chips 110 and 120 are stacked in the semiconductor package 100. Memory chip 110 is set as master and memory chip 120 is set as slave. Memory chip 120 is selected to be accessed by a chip address during a read or write operation. A master/slave setting signal MS1 and a slice select signal SE1 in the memory chip 110 have a high level and a low level, respectively, (MS1='high', SE1='low') and a master/slave setting signal MS2 and a slice select signal SE2 in the memory chip 120 have a low level and a high level, respectively (MS2='low', SE2='high'). Hereafter, a data transfer path during the write operation and a data transfer path during the read operation will be described separately. In FIG. 3, components represented by a dark color indicate disabled components.

During a write operation, write data inputted through the data pad 201a of the memory chip 110 set to master are loaded into the write data interlayer channel 217 through the data input unit 202a, the latch 204a, the serial-parallel conversion unit 210a, and the write data transmitting unit 218a. A data strobe signal inputted through the data strobe pad 205a of the memory chip 110 set as master to strobe write data is transferred to the latch 204a and the serial-parallel conversion unit 210a through a data strobe input unit 206a and the setup/hold control unit 208a. Furthermore, information for controlling write timing is loaded into the write timing interlayer channel 214 through the write timing control unit 209a and the write timing interface unit 215a.

The write data loaded in the write data interlayer channel 217 are transferred to the core area 228b through the write data receiving unit 216b and the data exchange unit 226b of the memory chip 120 selected to be accessed or selected to perform a write operation. The core area 228b stores the received write data. The timing information loaded in the write timing interlayer channel 214 is transferred to the write bus control unit 225b through the write timing receiving unit 213b, and the write bus control unit 225b controls the timing of the data exchange unit 226b using the transferred timing information.

That is, the write data inputted through the data pad 201a of the master memory chip 110 are serial-parallel converted by the master memory chip 110, and then transferred and stored into the memory chip 120 selected to be accessed.

Read data stored in the core area 228b of the memory chip 120 selected to be accessed during a read operation or selected to perform a read operation, are loaded into the read data interlayer channel 220 through the data exchange unit 226b and the read data transmitting unit 219b. Information for controlling read timing is also loaded into the read timing interlayer channel 223 through the read timing interface unit 222b from the read bus control unit 227b.

The read data loaded in the read data interlayer channel 220 are outputted to the outside through the data pad 201a via the read data receiving unit 221a, the parallel-serial conversion unit 211a, and the data output unit 203a of the memory chip 110 set as master. The timing information loaded in the read timing interlayer channel 223 is transferred to the read timing control unit 212a through the read timing receiving unit 224a of the memory chip 110, and the read timing control unit 212a controls the timing of the parallel-serial conversion unit 211a using this information. Furthermore, a clock generated by the DLL 248a is outputted to the outside through the data strobe pad 205a via the data strobe output unit 207a.

That is, the data read from the core area 228b of the memory chip 120 selected to perform a read operation are transferred to the master memory chip 110. Then, the read data are parallel-serial converted by the master memory chip 110 and outputted to the outside.

Figure 4:
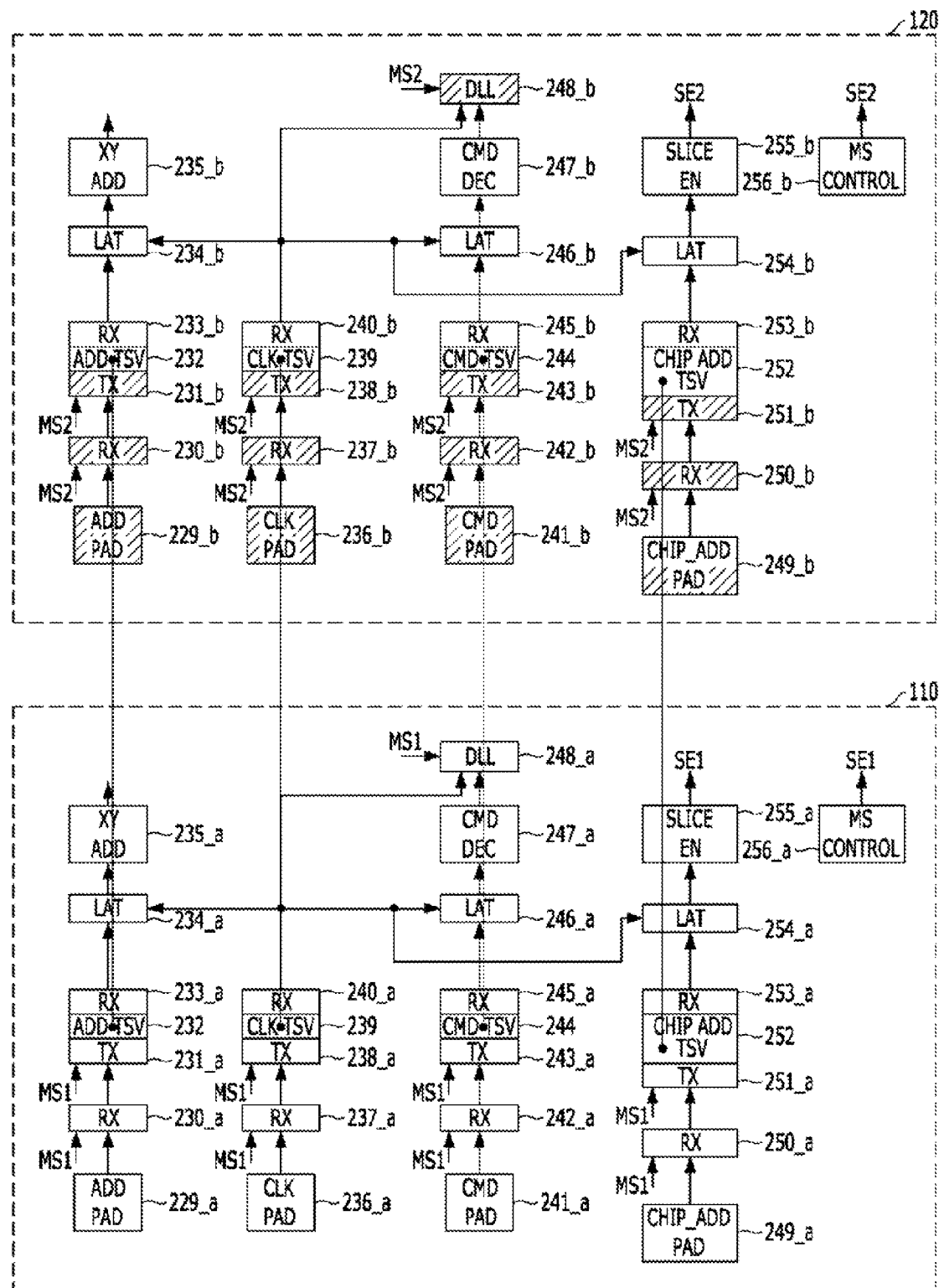
FIG. 4 is a diagram illustrating transfer paths of an address, a clock, a command, and a chip address in memory chips stacked in a semiconductor package in accordance with an embodiment of the present invention.

FIG. 4 is a diagram illustrating transfer paths of an address, a dock, a command, and a chip address in the memory chips 110 and 120 stacked in the semiconductor package 100. For convenience of description, FIG. 3 illustrates that two memory chips 110 and 120 are stacked in the semiconductor package 100. Memory chip 110 is set as master and memory chip 120 is set as slave. Memory chip 120 is selected to be accessed by a chip address during a read or write operation. The master/slave setting signal MS1 and the slice select signal SE1 in the memory chip 110 have a high level and a low level, respectively, (MS1='high', SE1='low') and the master/slave setting signal MS2 and the slice select signal SE2 in the memory chip 120 have a low level and a high level, respectively (MS2='low', SE2='high'). In FIG. 4, components represented by a dark color indicate disabled components.

An address inputted through the address pad 229a of the memory chip 110 set as master is loaded into the address interlayer channel 232 through the address interface unit 230a and the address transmitting unit 231a. A clock inputted through the clock pad 236a of the memory chip 110 set as master is loaded into the clock interlayer channel 239 through the clock interface unit 237a and the clock transmitting unit 238a. A command inputted through the command pad 241a of the memory chip 110 set as master is loaded into the command interlayer channel 244 through the command interface unit 242a and the command transmitting unit 243a. A chip address inputted through the chip address pad 249a of the memory chip 110 set as master is loaded into the chip address interlayer channel 252 through the chip address interface unit 250a and the chip address transmitting unit 251a.

In memory chip 110 set as master and memory chip 120 set as slave, the address loaded in the address interlayer channel 232 is received by the address receiving units 233a and 233b, and transferred to the address latch units 234a and 234b and the row/column address generation units 235a and 235b. In memory chip 110 set as master and memory chip 120 set as slave, the clock loaded in the dock interlayer channel 238 is received by the clock receiving units 240a and 240b and transferred to the latch units 234a, 234b, 240a, 240b, 254a, and 254b and the DLLs 248a and 248b. In memory chip 110 set as master and memory chip 120 set as slave, the command loaded in the command interlayer channel 244 is received by the command receiving units 245a and 245b, and transferred to the command latch units 240a and 240b and the command decoders 247a and 247b. In memory chip 110 set as master and memory chip 120 set as slave, the chip address loaded in the chip address interlayer channel 252 is received by the chip address receiving units 253a and 253b, and transferred to the chip address latch units 254a and 254b and the slice select signal generation units 256a and 256b. The master/slave setting units 256a and 255b activates or deactivates the signals MS1 and MS2 depending on settings.

The address, the command, the clock, and the chip address that are inputted through the pads 229a, 246a, 241a, and 249a of the master memory chip 110 are transferred to the chips 110 and 120 through the interlayer channels 232, 239, 244, and 252.

FIGS. 3 and 4 illustrate an embodiment of the present invention wherein a semiconductor package includes two memory chips. However, a semiconductor package according to an embodiment of the present invention may include any number of memory chips and may operate in the same manner.

In this embodiment of the present invention, it has been described that the respective chips generate the slice select signals SE1 and SE2 and the master/slave setting signals MS1 and MS2. However, the signals SE1, SE2, MS1, and MS2 may be generated by a memory chip set as master then transferred to memory chips set as slaves. Furthermore, the slice select signals SE1 and SE2 and the master/slave setting signals MS1 and MS2 may be generated by a memory controller and then transferred to the respective memory chips through separate channels.

When the semiconductor package 100 includes only one memory chip (for example, the memory chip 110), the slice select signal SE and the master/slave setting signal MS are controlled to be always activated in the memory chip 110.

In accordance with the embodiments of the present invention, a plurality of memory chips stacked in one package may operate as a master or slaves, while the memory chips have the same configuration.

Although various embodiments have been described for illustrative purposes, it will be apparent to those skilled in the art that various changes and modifications may be made without departing from the spirit and scope of the invention as defined in the following claims.

What is claimed is:

1. A memory chip comprising:
 a data processing block suitable for serial-parallel converting data inputted and for parallel-serial converting data to be outputted;
 a write data transmitting unit suitable for transmitting the data serial-parallel converted by the data processing block to a write data interlayer channel;
 a write data receiving unit suitable for receiving data from the write data interlayer channel, the data to be written to a core area;
 a read data receiving unit suitable for receiving data from a read data interlayer channel, the data to be parallel-serial converted by the data processing block;
 a read data transmitting unit suitable for transmitting data read from the core area to the read data interlayer channel;
 a write timing control unit suitable for controlling operation timing of the serial-parallel conversion unit;
 a write timing interface unit suitable for transmitting write timing information of the write timing control unit to a write timing interlayer channel;
 a write timing receiving unit suitable for receiving the write timing information of the write timing interlayer channel;
 a data exchange unit suitable for controlling data exchange between the write data receiving unit and the core area and data exchange between the read data transmitting unit and the core area; and
 a write bus control unit suitable for controlling data transfer timing at which the data exchange unit transfers data from the write data receiving unit to the core area, using the write timing information transferred from the write timing receiving unit,
 wherein enablement of the data processing block, the write data transmitting unit, and the read data receiving unit depends on whether the memory chip is set as master or slave.

2. The memory chip of claim 1, wherein enablement of the write data receiving unit and the read data transmitting unit depends on whether the memory chip is selected to be accessed or not.

3. The memory chip of claim 2, wherein the data processing block comprises:
 a serial-parallel conversion unit suitable for serial-parallel converting the data inputted; and a parallel-serial conversion unit suitable for parallel-serial converting data to be outputted.

4. The memory chip of claim 3, further comprising:
a read timing control unit suitable for controlling operation timing of the parallel-serial conversion unit;
a read timing interface unit suitable for transmitting read timing information to a read timing interlayer channel;
a read timing receiving unit suitable for receiving the read timing information of the read timing interlayer channel and transfer the received information to the read timing control unit; and
a read bus control unit suitable for controlling data transfer timing at which the data exchange unit transfers data from the core area to the read data transmitting unit, and transfer the read timing information to the read timing transmitting unit.

5. The memory chip of claim 4, wherein enablement of the write timing control unit, the read timing control unit, the write timing transmitting unit, and the read timing receiving unit depends on whether the memory chip is set as master or slave.

6. The memory chip of claim 4, wherein enablement of the write timing receiving unit, the read timing receiving unit, the data exchange unit, the write bus control unit, and the read bus control unit depends on whether the memory chip is selected to be accessed or not.

7. The memory chip of claim 1, further comprising a data strobe input/output unit suitable for transferring a data strobe signal inputted through one or more data strobe pads to the data processing block, and for outputting a data strobe signal through the one or more data strobe pads,
wherein the data strobe signal is synchronized with the data to be outputted, and
wherein enablement of the data strobe input/output unit depends on whether the memory chip is set as master or slave.

8. The memory chip of claim 1, further comprising:
an address interface unit suitable for transferring an inputted address to an address interlayer channel;
a command interface unit suitable for transferring an inputted command to a command interlayer channel; and
a clock interface unit suitable for transferring an inputted clock to a clock interlayer channel.

9. The memory chip of claim 8, wherein enablement of the address interface unit, the command interface unit, and the clock interface unit depends on whether the memory chip is set as master or slave.

10. The memory chip of claim 9, further comprising:
a chip address interface unit suitable for transferring an inputted chip address to a chip address interlayer channel; and
a slice select signal generation unit suitable for decoding the chip address loaded in the chip address interlayer channel and for generating a slice select signal,
wherein enablement of the chip address interface unit depends on whether the memory chip is set as master or slave.

11. A semiconductor package comprising:
a plurality of memory chips stacked, wherein one of the memory chips is set as master, and the remaining memory chips are set as slaves, so that the memory chip set as master serial-parallel converts the write data inputted from outside, then transfers the serial-parallel converted data to a memory chip selected to be accessed from the memory chips set as slaves, and the memory chip set as master parallel-serial converts read data from a memory chip selected to be accessed from the memory chips set as slaves, then outputs the parallel-serial converted data to the outside,
wherein each of the memory chips comprises:
a data processing block suitable for serial-parallel converting data inputted and for parallel-serial converting data to be outputted;
a write data transmitting unit suitable for transmitting the data serial-parallel converted by the data processing block to a write data interlayer channel;
a write data receiving unit suitable for receiving data from the write data interlayer channel, the data to be written to a core area;
a read data receiving unit suitable for receiving data from a read data interlayer channel, the data to be parallel-serial converted by the data processing block;
a read data transmitting unit suitable for transmitting data read from the core area to the read data interlayer channel;
a write timing control unit suitable for controlling operation timing of the serial-parallel conversion unit;
a write timing interface unit suitable for transmitting write timing information of the write timing control unit to a write timing interlayer channel;
a write timing receiving unit suitable for receiving the write timing information of the write timing interlayer channel;
a data exchange unit suitable for controlling data exchange between the write data receiving unit and the core area and data exchange between the read data transmitting unit and the core area; and
a write bus control unit suitable for controlling data transfer timing at which the data exchange unit transfers data from the write data receiving unit to the core area, using the write timing information transferred from the write timing receiving unit,
wherein enablement of the data processing block, the write data transmitting unit, and the read data receiving unit depends on whether the memory chip is set as master or slave.

12. The semiconductor package of claim 11, wherein the memory chip set as master transfers an address, a command, and a clock inputted from the outside to the memory chips set as slaves.

13. The semiconductor package of claim 11, wherein enablement of the write data receiving unit and the read data transmitting unit depends on whether the memory chip is selected to be accessed or not.

14. The semiconductor package of claim 13, wherein the data processing block comprises:
a serial-parallel conversion unit suitable for serial-parallel converting the data inputted; and
a parallel-serial conversion unit suitable for parallel-serial converting data to be outputted.

15. The semiconductor package of claim 14, wherein each of the memory chips further comprises:
a read timing control unit suitable for controlling operation timing of the parallel-serial conversion unit;
a read timing transmitting unit suitable for transmitting read timing information to a read timing interlayer channel;
a read timing receiving unit suitable for receiving the read timing information of the read timing interlayer channel and transfer the received information to the read timing control unit; and
a read bus control unit suitable for controlling data transfer timing at which the data exchange unit transfers data from the core area to the read data transmitting unit, and transfer the read timing information to the read timing transmitting unit.

* * * * *